United States Patent
Sugimoto et al.

(10) Patent No.: US 9,565,751 B2
(45) Date of Patent: Feb. 7, 2017

(54) SUSPENSION BOARD WITH CIRCUIT

(71) Applicant: NITTO DENKO CORPORATION, Osaka (JP)

(72) Inventors: Yuu Sugimoto, Osaka (JP); Hiroyuki Tanabe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/877,424

(22) Filed: Oct. 7, 2015

(65) Prior Publication Data
US 2016/0105954 A1   Apr. 14, 2016

(30) Foreign Application Priority Data
Oct. 14, 2014   (JP) ................... 2014-209729

(51) Int. Cl.
| | |
|---|---|
| *G11B 5/48* | (2006.01) |
| *H05K 1/02* | (2006.01) |
| *H05K 3/46* | (2006.01) |
| *H05K 1/05* | (2006.01) |

(52) U.S. Cl.
CPC .......... *H05K 1/0271* (2013.01); *G11B 5/4853* (2013.01); *H05K 3/4685* (2013.01); *G11B 5/484* (2013.01); *H05K 1/056* (2013.01); *H05K 2201/09245* (2013.01); *H05K 2203/0323* (2013.01)

(58) Field of Classification Search
None
See application file for complete search history.

(56) References Cited

U.S. PATENT DOCUMENTS

| | | | | |
|---|---|---|---|---|
| 5,812,344 A * | 9/1998 | Balakrishnan | ....... | G11B 5/4853 360/244.3 |
| 6,399,899 B1* | 6/2002 | Ohkawa | ................ | H01R 13/58 174/255 |
| 7,336,446 B2* | 2/2008 | Kanagawa | ............. | G11B 5/486 360/245.9 |
| 8,080,740 B2* | 12/2011 | Honjo | .................. | G11B 5/484 174/261 |

(Continued)

FOREIGN PATENT DOCUMENTS

JP   2009-129490 A   6/2009

*Primary Examiner* — Will J Klimowicz
(74) *Attorney, Agent, or Firm* — Jean C. Edwards, Esq.; Edwards Neils LLC

(57) ABSTRACT

A suspension board with circuit includes a metal supporting board, a first insulating layer including a disposing portion formed at one side in a thickness direction of the metal supporting board, a first conductive layer including a first wire portion formed at the one side of the first insulating layer, a second insulating layer including a covering portion covering the first wire portion, and a second conductive layer including a second wire portion formed at the one side of the second insulating layer and a terminal portion connected to the first or second wire portion. The second insulating layer includes a second terminal supporting portion formed at the other of the terminal portion. The first insulating layer includes a first terminal supporting portion formed at the other side of the second terminal supporting portion. The metal supporting board is not formed at the other side thereof.

5 Claims, 12 Drawing Sheets

(56) References Cited

U.S. PATENT DOCUMENTS

2009/0014410 A1\* 1/2009 Yokai ..................... G11B 5/484
                                                      216/17
2009/0151994 A1   6/2009 Ohsawa et al.
2015/0156892 A1\* 6/2015 Tanabe ................. H05K 3/4661
                                                     205/125

\* cited by examiner

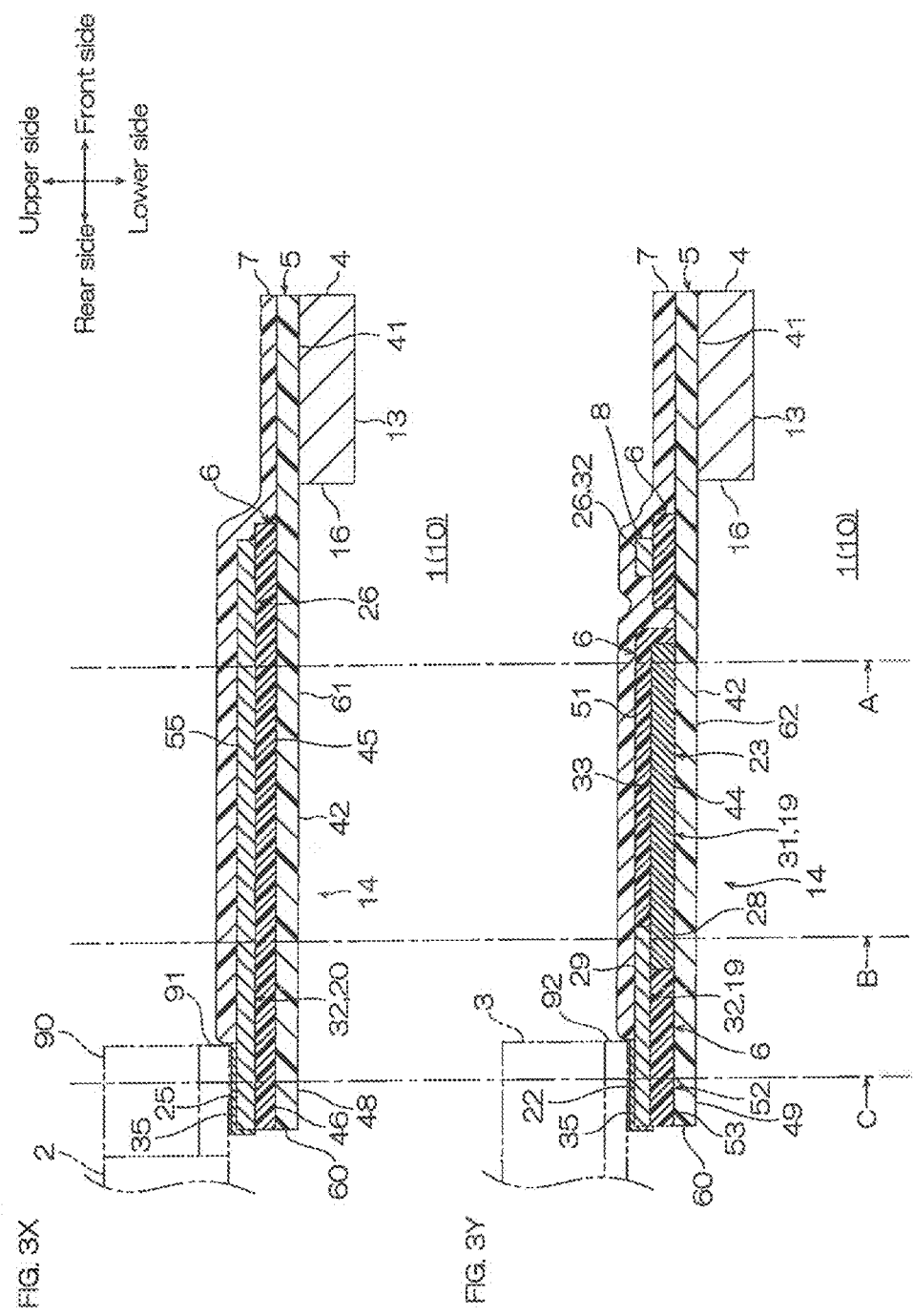

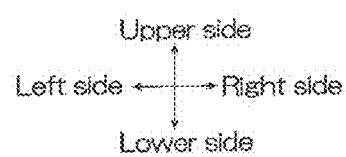
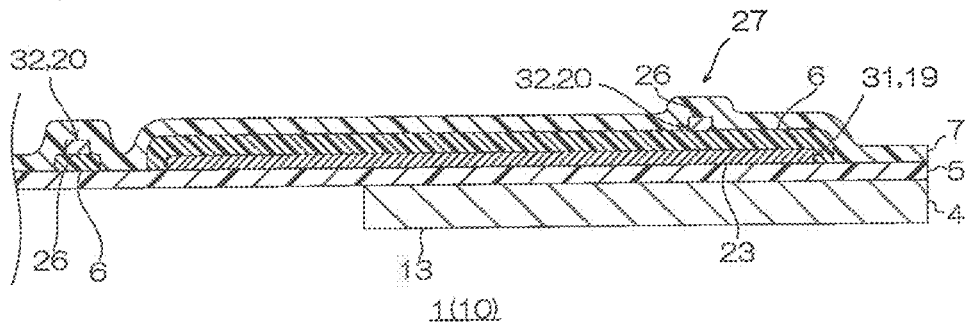
FIG. 4A
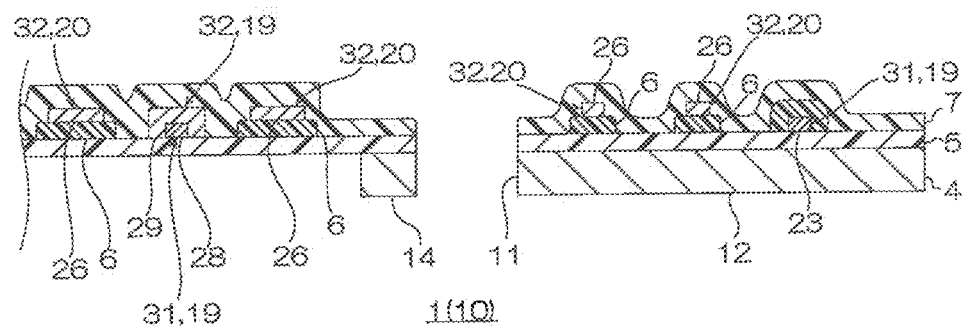
FIG. 4B
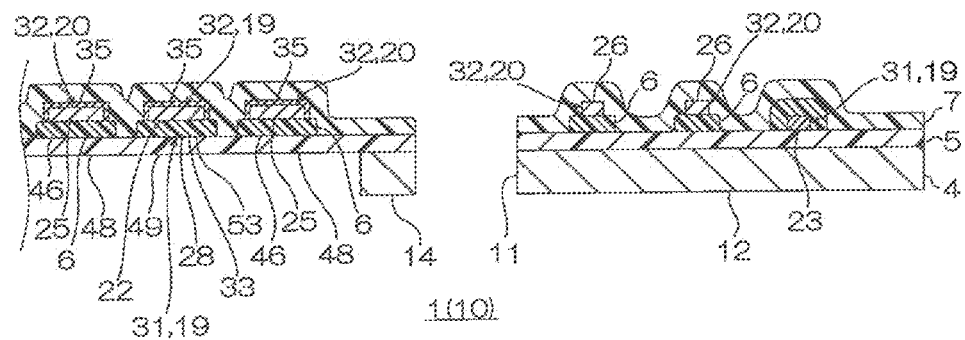
FIG. 4C

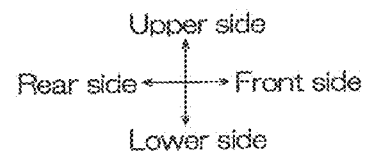
FIG. 5A
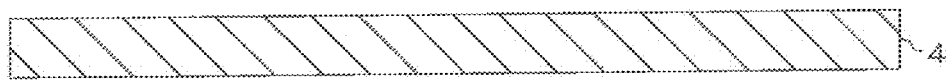
FIG. 5B
FIG. 5C
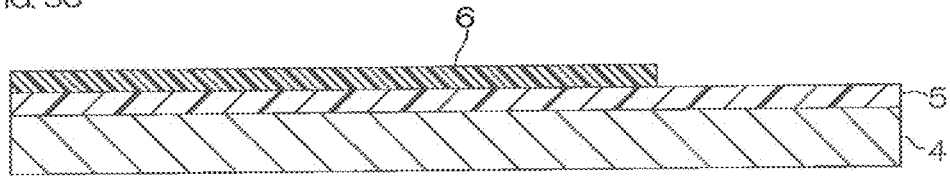
FIG. 5D
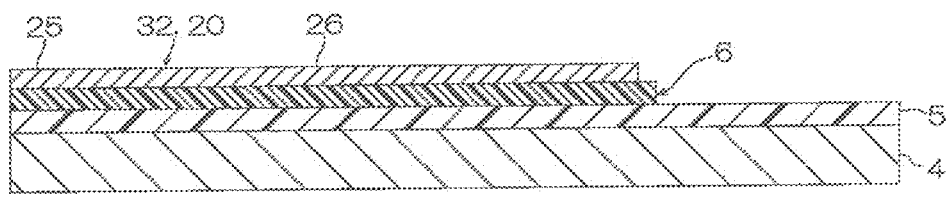

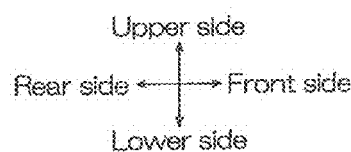
FIG. 6A
FIG. 6B
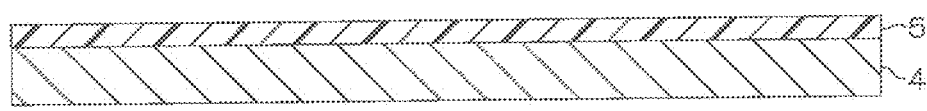
FIG. 6C
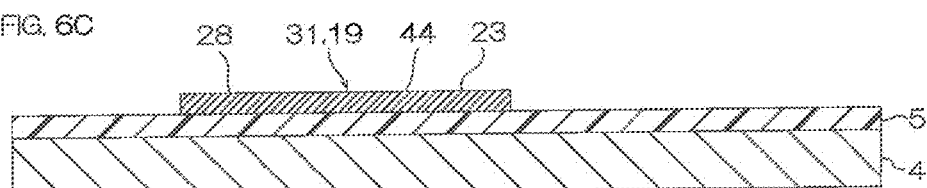
FIG. 6D
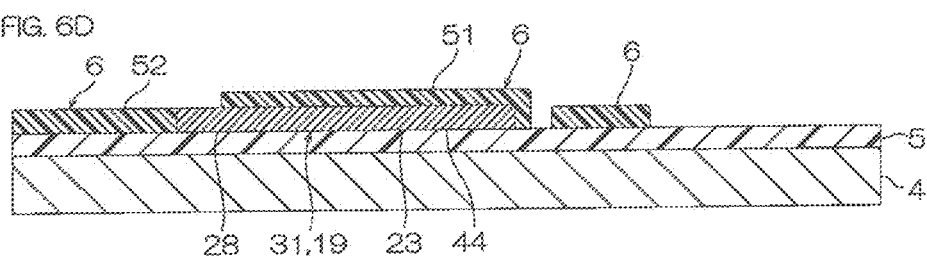
FIG. 6E
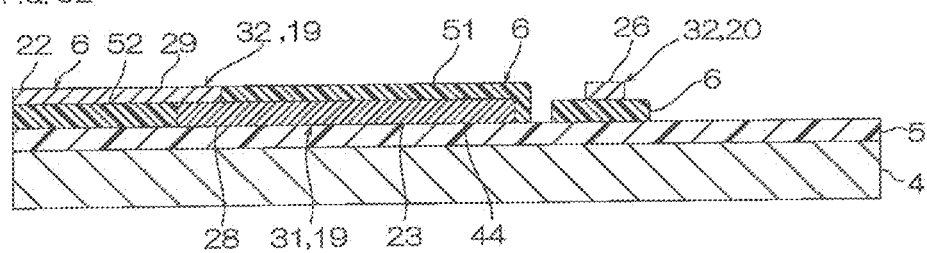

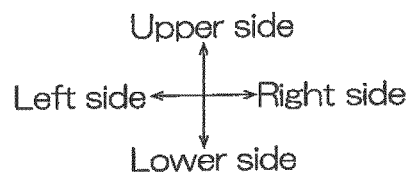
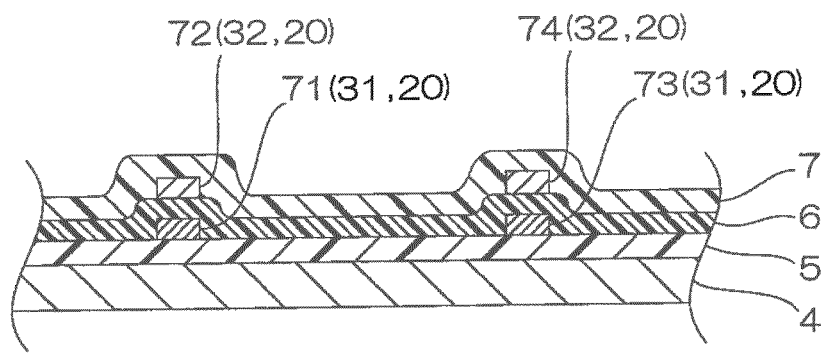
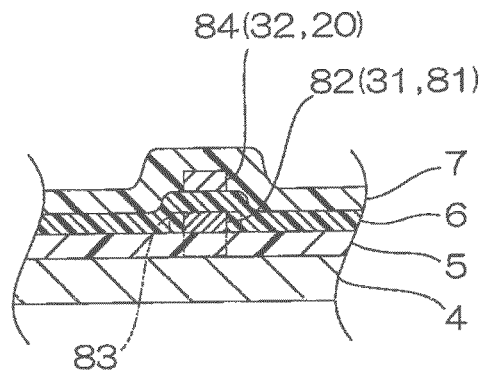

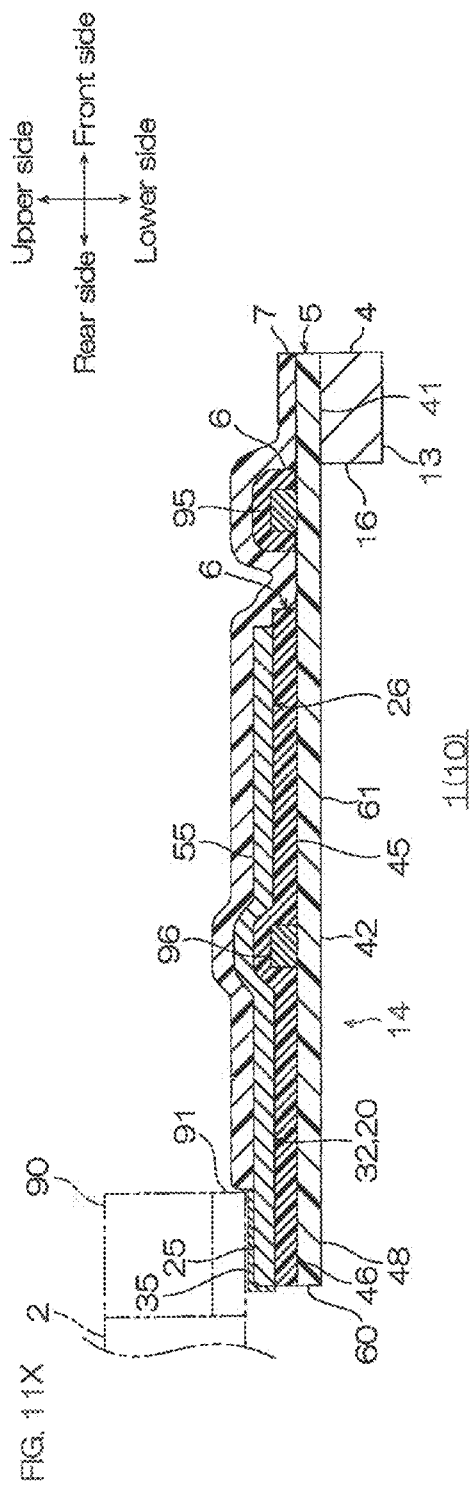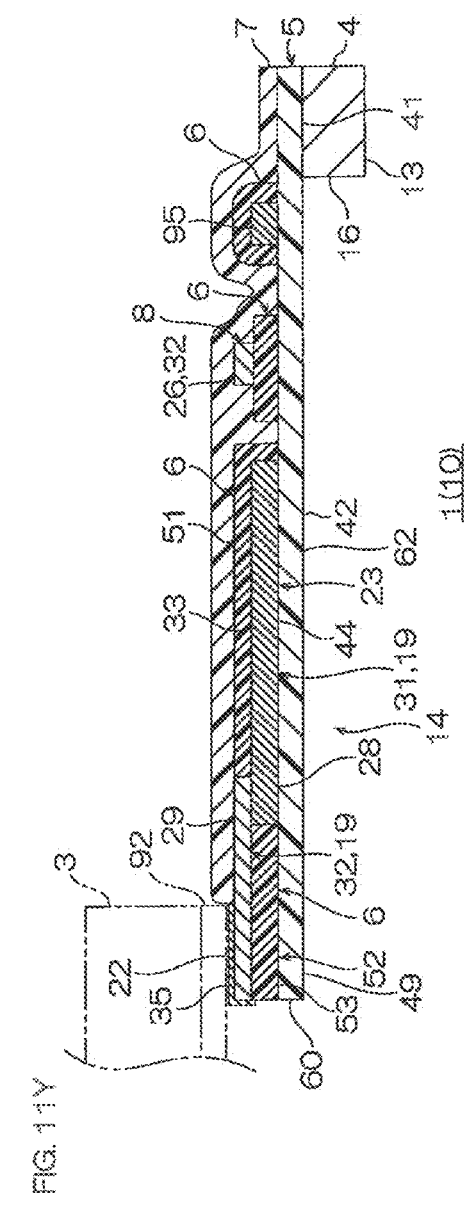

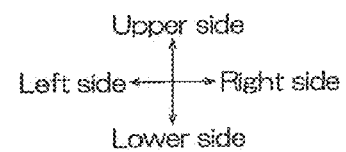
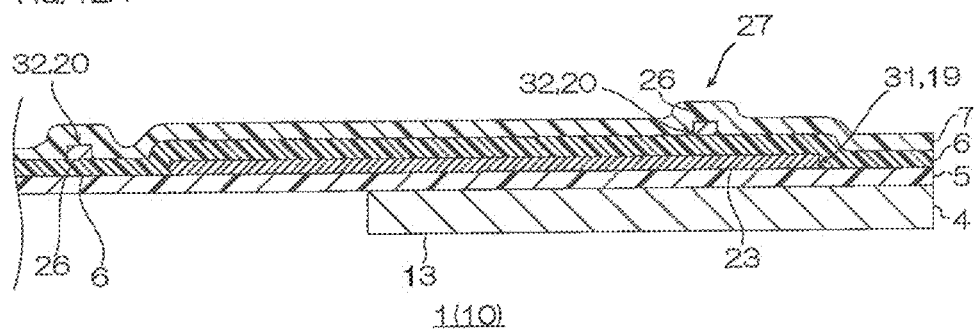
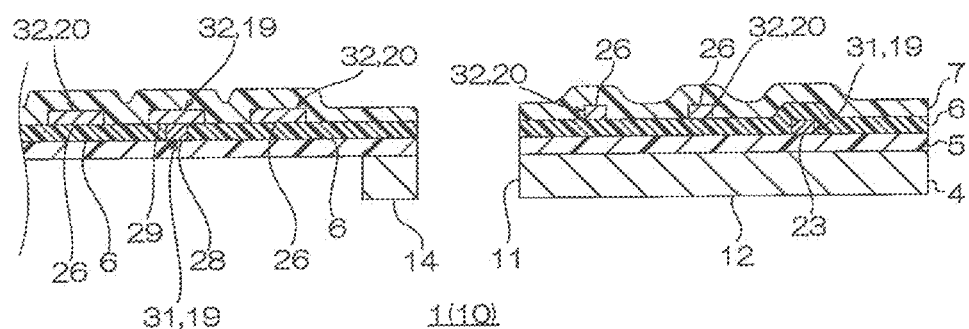
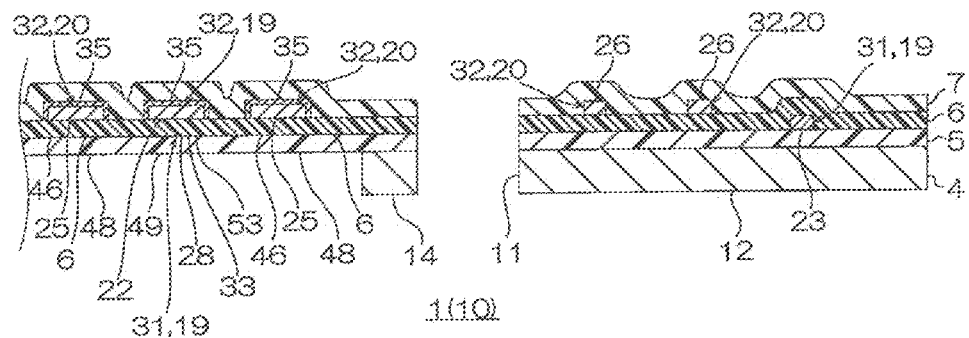

SUSPENSION BOARD WITH CIRCUIT

CROSS-REFERENCE TO RELATED APPLICATION

The present application claims priority from Japanese Patent Application No. 2014-209729 filed on Oct. 14, 2014, the contents of which are hereby incorporated by reference into this application.

BACKGROUND OF THE INVENTION

Field of the Invention

The present invention relates to a suspension board with circuit, to be specific, to a suspension board with circuit used in a hard disk drive.

Description of Related Art

A suspension board with circuit is mounted with a slider on which a magnetic head is mounted and is used in a hard disk drive or the like. As such a suspension board with circuit, a suspension board with circuit including a metal supporting layer, a first base insulating layer formed on the metal supporting layer, a first conductive layer formed on the first base insulating layer and having a first terminal portion and a first wire, a second base insulating layer formed on the first base insulating layer so as to cover the first conductive layer, and a second conductive layer formed on the second base insulating layer and having a second terminal portion and a second wire has been proposed (ref: for example, Japanese Unexamined Patent Publication No. 2009-129490). In the suspension board with circuit, the number of wires and terminal portions can be increased, so that a degree of freedom in design can be improved.

In such a suspension board with circuit, while the first wire and the second wire are disposed in an up-down direction, the first terminal portion and the second terminal portion are required to be disposed on the same plane so as to be connected to a connecting terminal of a magnetic head. The entire terminal portions are supported by the first base insulating layer. That is, in the suspension board with circuit, the terminal portions connected to the connecting terminal of the magnetic head are disposed on the upper surface of the base insulating layer that is laminated on the metal supporting layer.

SUMMARY OF THE INVENTION

In the suspension board with circuit described in Japanese Unexamined Patent Publication No. 2009-129490, however, by a change in the environmental temperature or the like, the metal supporting board and the magnetic head may expand at different proportions based on a difference in coefficient of thermal expansion of the metal supporting board and the magnetic head. In such a case, there may be a case where distortion occurs in a connecting portion between the connecting terminal of the magnetic head and each terminal portion, thereby causing a crack.

Thus, to suppress the above-described occurrence of distortion, it has been considered that at the lower side of the above-described connecting portion, an opening is formed in the metal supporting board and stress applied to the above-described connecting portion is relaxed. However, the absence of the metal supporting board at the lower side of the above-described connecting portion reduces its rigidity, so that the application of stress to the terminal portion may deform the terminal portion.

It is an object of the present invention to provide a suspension board with circuit that is capable of relaxing stress applied to a connecting portion between a connecting terminal of an electronic component and a terminal portion and is capable of reinforcing the terminal portion.

[1] A suspension board with circuit of the present invention includes a metal supporting board, a first insulating layer including a disposing portion formed at one side in a thickness direction of the metal supporting board with respect to the metal supporting board, a first conductive layer including a first wire portion formed at the one side with respect to the first insulating layer, a second insulating layer including a covering portion covering the first wire portion, and a second conductive layer including a second wire portion formed at the one side with respect to the second insulating layer and a terminal portion connected to the first wire portion or the second wire portion, wherein the second insulating layer includes a second terminal supporting portion formed at the other side in the thickness direction with respect to the terminal portion; the first insulating layer includes a first terminal supporting portion formed at the other side with respect to the second terminal supporting portion; and the metal supporting board is not formed at the other side with respect to the first terminal supporting portion.

According to the suspension board with circuit, the metal supporting board is not formed at the other side in the thickness direction with respect to the terminal portion.

Thus, when the metal supporting board and an electronic component expand at different proportions and stress is applied to a connecting portion between a connecting terminal of the electronic component and the terminal portion in a state where the terminal portion is connected to the connecting terminal of the electronic component, the stress can be relaxed.

Also, the second terminal supporting portion is formed below the terminal portion and the first terminal supporting portion is formed below the second terminal supporting portion.

Thus, the terminal portion can be reinforced by the first terminal supporting portion and the second terminal supporting portion. As a result, according to the suspension board with circuit of the present invention, the stress applied to the connecting portion between the connecting terminal of the electronic component and the terminal portion can be relaxed, while the terminal portion can be reinforced.

[2] The present invention includes the suspension board with circuit described in the above-described [1] in which the terminal portion has a free end edge and the first terminal supporting portion and the second terminal supporting portion extend to the free end edge.

According to the suspension board with circuit, the terminal portion can be reinforced by the entire first terminal supporting portion and second terminal supporting portion.

Thus, the terminal portion can be surely reinforced.

[3] The present invention includes the suspension board with circuit described in the above-described [1] or [2] in which the first wire portion or the second wire portion includes an extended portion extending from the connecting portion with the terminal portion along a longitudinal direction of the terminal portion; the second insulating layer further includes a second extended supporting portion that is, when projected in the thickness direction, overlapped with the extended portion; the first insulating layer further includes a first extended supporting portion that is, when projected in the thickness direction, overlapped with the extended portion; and the metal supporting board is, when projected in the thickness direction, not overlapped with the extended portion.

According to the suspension board with circuit, the metal supporting board is, when projected in the thickness direction, formed so as not to be overlapped with the second extended supporting portion and the first extended supporting portion.

Thus, stress applied to the periphery of the extended portion can be relaxed.

As a result, stress applied to the connecting portion between the connecting terminal of the electronic component and the terminal portion can be further relaxed.

The first extended supporting portion and the second extended supporting portion are, when projected in the thickness direction, overlapped with the extended portion.

Thus, the extended portion can be reinforced by the first extended supporting portion and the second extended supporting portion.

[4] The present invention includes the suspension board with circuit described in any one of the above-described [1] and [3] in which the first conductive layer includes a conductive reinforcing portion extending in a direction crossing the longitudinal direction of the terminal portion and the metal supporting board is, when projected in the thickness direction, not overlapped with the conductive reinforcing portion.

According to the suspension board with circuit, the conductive reinforcing portion extends in the direction crossing the longitudinal direction of the terminal portion.

Thus, when force is applied in a direction orthogonal to the longitudinal direction of the terminal portion with respect to the suspension board with circuit, the suspension board with circuit is reinforced by the conductive reinforcing portion and a warp of the suspension board with circuit can be suppressed.

[5] The present invention includes the suspension board with circuit described in the above-described [4] in which the conductive reinforcing portion, when projected in the thickness direction, crosses the second wire portion.

According to the suspension board with circuit, a region in which the second wire portion is disposed in the suspension board with circuit can be reinforced by the conductive reinforcing portion.

Thus, the warp of the region in which the second wire portion is disposed in the suspension board with circuit can be suppressed.

BRIEF DESCRIPTION OF THE DRAWINGS

FIG. 3X shows a sectional view along an X-X line of the suspension board with circuit shown in FIG. 2.

FIG. 3Y shows a sectional view along a Y-Y line in FIG. 2.

FIG. 4A shows a sectional view along an A-A line of the suspension board with circuit shown in FIG. 2.

FIG. 4B shows a sectional view along a B-B line of the suspension board with circuit shown in FIG. 2.

FIG. 4C shows a sectional view along a C-C line of the suspension board with circuit shown in FIG. 2.

FIGS. 5A to 5D show process drawings for illustrating a method for producing a suspension board with circuit and show sectional views corresponding to FIG. 3X:

FIG. 5A illustrating a step of preparing a metal supporting board,

FIG. 5B illustrating a step of providing a base insulating layer,

FIG. 5C illustrating a step of providing an intermediate insulating layer, and

FIG. 5D illustrating a step of providing a second conductive layer.

FIGS. 6A to 6E show process drawings for illustrating a method for producing a suspension board with circuit and show sectional views corresponding to FIG. 3Y:

FIG. 6A illustrating a step of preparing a metal supporting board,

FIG. 6B illustrating a step of providing a base insulating layer,

FIG. 6C illustrating a step of providing a first conductive layer,

FIG. 6D illustrating a step of providing an intermediate insulating layer, and

FIG. 6E illustrating a step of providing a second conductive layer.

FIG. 7E illustrating a step of providing a cover insulating layer,

FIG. 7F illustrating a step of forming a terminal opening portion, and

FIG. 7G illustrating a step of providing an electrolytic plating layer.

FIG. 8F illustrating a step of providing a cover insulating layer,

FIG. 8G illustrating a step of forming a terminal opening portion, and

FIG. 8H illustrating a step of providing an electrolytic plating layer.

FIG. 9A shows a sectional view for illustrating a second embodiment of a suspension board with circuit of the present invention.

FIG. 9B shows a sectional view for illustrating a third embodiment of a suspension board with circuit of the present invention.

FIG. 11X shows a sectional view along an X-X line of the suspension board with circuit shown in FIG. 10.

FIG. 11Y shows a sectional view along a Y-Y line in FIG. 10.

FIG. 12A shows a sectional view for illustrating a fifth embodiment of a suspension board with circuit of the present invention, corresponding to FIG. 4A.

FIG. 12B shows a sectional view for illustrating a fifth embodiment of a suspension board with circuit of the present invention, corresponding to FIG. 4B.

FIG. 12C shows a sectional view for illustrating a fifth embodiment of a suspension board with circuit of the present invention, corresponding to FIG. 4C.

DETAILED DESCRIPTION OF THE INVENTION

1. Summary of First Embodiment of Suspension Board with Circuit

A first embodiment of a suspension board with circuit of the present invention is described with reference to FIGS. 1, 2, 3X, 3Y, and 4A to 4C.

Figure 1:
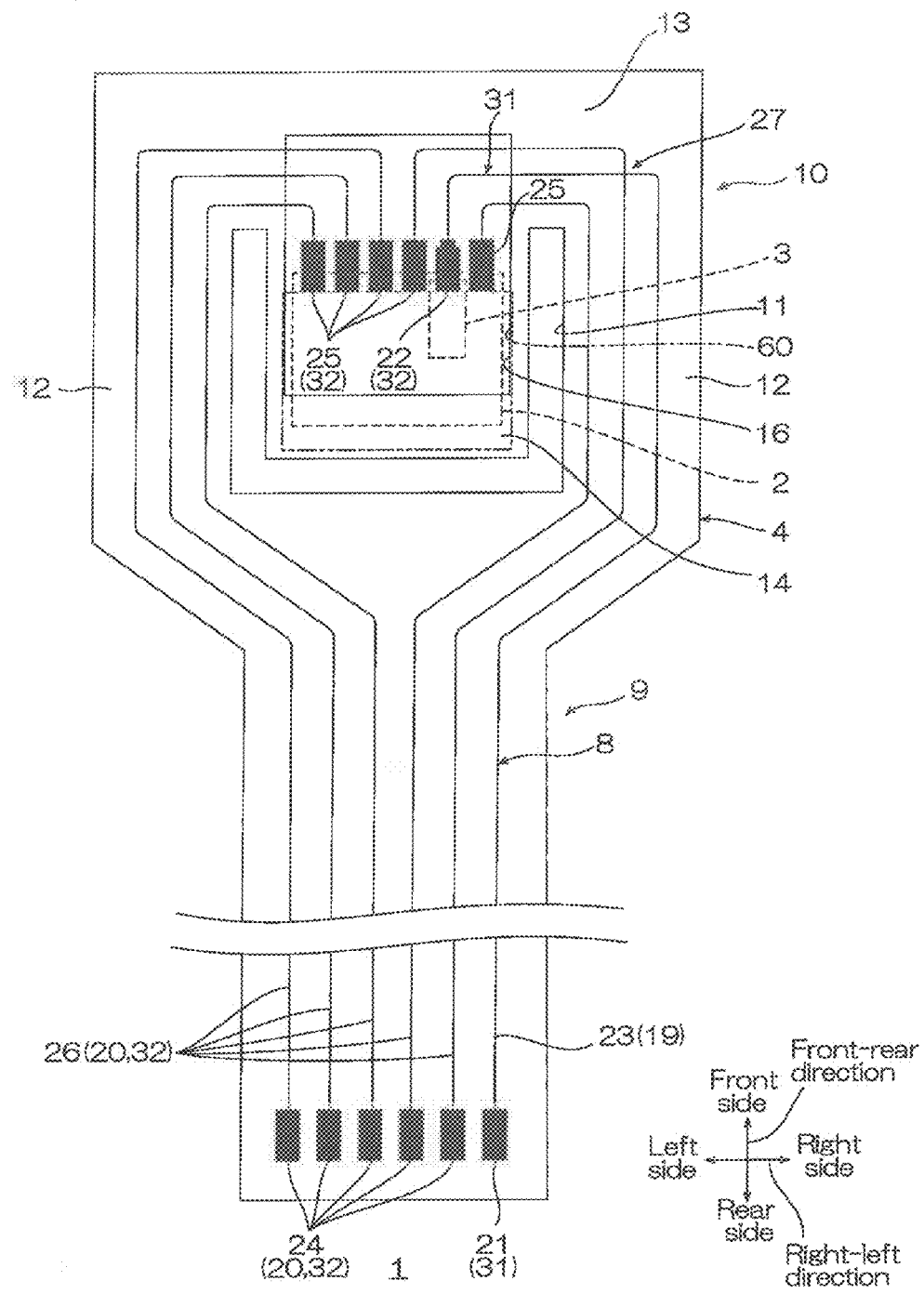
FIG. 1 shows a plan view for illustrating one embodiment of a suspension board with circuit of the present invention.
Figure 2:
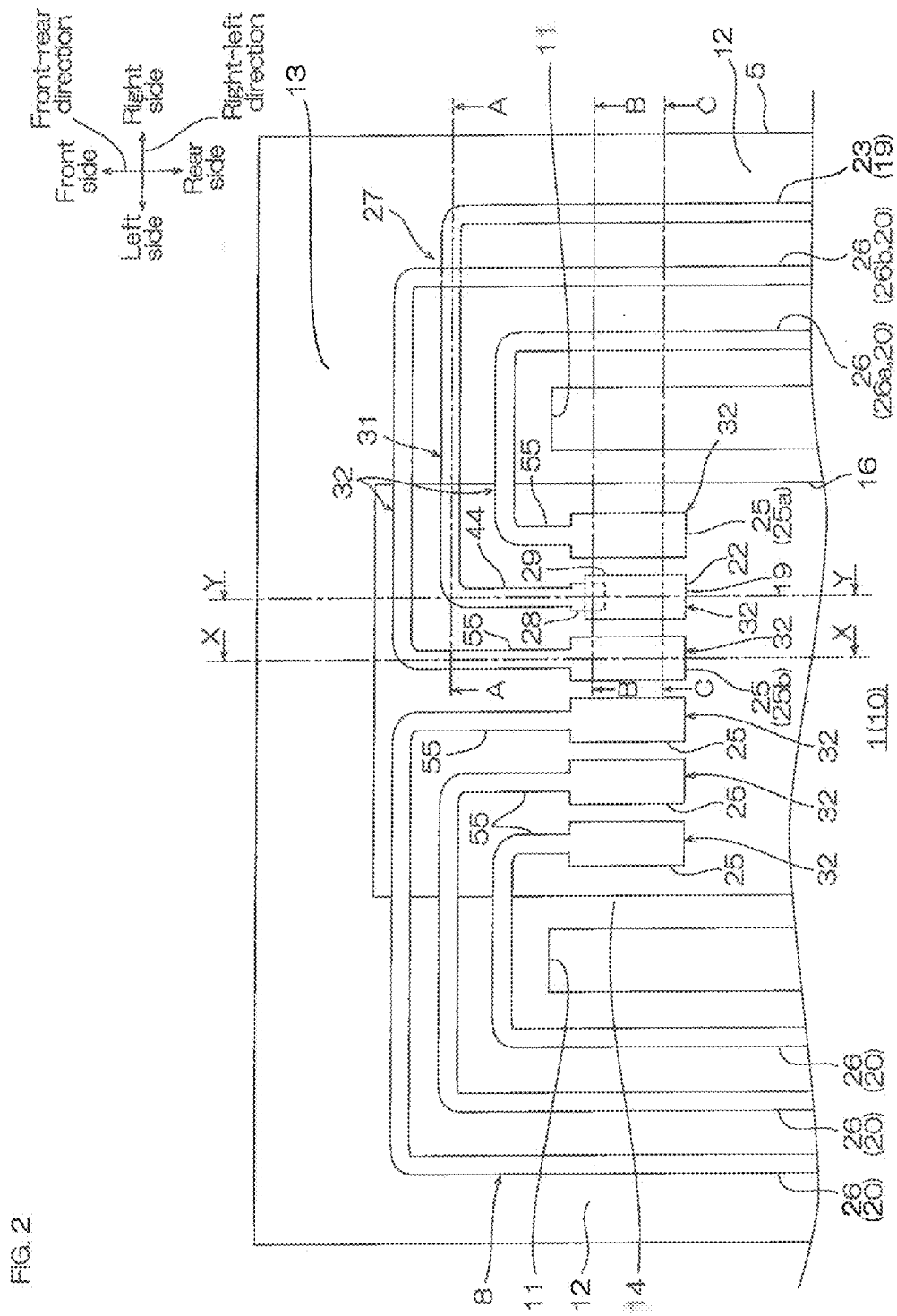
FIG. 2 shows an enlarged plan view of a folded-back portion and a tongue portion of the suspension board with circuit shown in FIG. 1.

In the following description, when referring to directions of the suspension board with circuit, the up-down direction of the paper surface in FIG. 1 is referred to as a front-rear direction (first direction); the right-left direction of the paper surface in FIG. 1 is referred to as a right-left direction (widthwise direction, second direction orthogonal to the first direction); and the direction connecting the near side of the paper surface to the far side of the paper surface in FIG. 1 is referred to as an up-down direction (thickness direction, third direction orthogonal to the first direction and the second direction). The upper side of the paper surface in FIG. 1 is referred to as a front side (one side in the first direction) and the lower side of the paper surface in FIG. 1 is referred to as a rear side (the other side in the first direction). The left side of the paper surface in FIG. 1 is referred to as a left side (one side in the second direction) and the right side of the paper surface in FIG. 1 is referred to as a right side (the other side in the second direction). The near side of the paper surface in FIG. 1 is referred to as an upper side (one side in the thickness direction, one side in the third direction) and the far side of the paper surface in FIG. 1 is referred to as a lower side (the other side in the thickness direction, the other side in the third direction). Directions in each view subsequent to FIG. 2 are in conformity with directions in FIG. 1.

In FIG. 1, a base insulating layer 5, an intermediate insulating layer 6, a cover insulating layer 7, and an electrolytic plating layer 35 are omitted so as to clearly show the relative arrangement of a metal supporting board 4 and a conductive pattern 8.

As shown in FIG. 1, in a suspension board with circuit 1, the conductive pattern 8 is supported by the metal supporting board 4.

The metal supporting board 4 integrally includes a main body portion 9 and a gimbal portion 10 that is provided at the front side of the main body portion 9. The main body portion 9 is formed into a generally rectangular shape in plane view extending in the front-rear direction.

The gimbal portion 10 is provided continuously from the front end edge of the main body portion 9 forwardly. The gimbal portion 10 is formed into a generally rectangular shape in plane view expanding toward both outer sides in the right-left direction with respect to the main body portion 9. At the central portion of the gimbal portion 10, a slit 11 in a generally U-shape in plane view passing through the metal supporting board 4 in the thickness direction and having an opening forwardly is provided. The gimbal portion 10 includes outrigger portions 12, a folded-back portion 13, and a tongue portion 14. The outrigger portions 12 are disposed at both outer sides in the right-left direction of the slit 11. Each of one pair of outrigger portions 12 is formed into a generally rectangular shape in plane view extending in the front-rear direction.

The folded-back portion 13 is formed so as to be disposed between the front end portions of the one pair of outrigger portions 12. The folded-back portion 13 is formed into a generally rectangular shape in plane view extending in the right-left direction.

The tongue portion 14 is disposed at the inner side in the right-left direction of the slit 11. The tongue portion 14 extends in a generally rectangular tongue shape in plane view from the rear end edge of the folded-back portion 13 rearwardly. An opening portion 16 is provided in the tongue portion 14 and the folded-back portion 13.

The opening portion 16, in the folded-back portion 13 and the tongue portion 14, passes through the metal supporting board 4 in the thickness direction 4. To be specific, the opening portion 16 is disposed over the folded-back portion 13 and the tongue portion 14 and is disposed at spaced intervals to the inner side in the right-left direction of the slit 11. The opening portion 16 is formed into a generally rectangular shape in plane view extending in the front-rear direction.

The conductive pattern 8 is provided over the front end portion and the rear end portion of the suspension board with circuit 1 and includes a power source pattern 19 and a plurality (five pieces) of signal patterns 20.

The power source pattern 19 integrally includes a power source-side terminal 21 that is provided in the main body portion 9, an element-side terminal 22 and a terminal extended portion 29 that are provided in the gimbal portion 10, and, as one example of a first wire portion, a power source wire 23 that electrically connects the power source-side terminal 21 to the element-side terminal 22 and the terminal extended portion 29. Each of the plurality of signal patterns 20 integrally includes external terminals 24 that are provided in the main body portion 9, head-side terminals 25 that are provided in the gimbal portion 10, and, as one example of a second wire portion, signal wires 26 that electrically connect the external terminals 24 to the head-side terminals 25. The head-side terminal 25 and the above-described element-side terminal 22 are one example of a terminal portion.

The power source-side terminal 21 and the plurality of external terminals 24 are, in the rear end portion of the main body portion 9, disposed at spaced intervals to each other in the right-left direction. Each of the power source-side terminal 21 and the plurality of external terminals 24 is formed into a generally rectangular square land shape in plane view. The power source-side terminal 21 is disposed at space intervals to the right side with respect to the plurality of external terminals 24. The power source-side terminal 21 is a terminal so as to be electrically connected to a power source (not shown). The plurality of external terminals 24 are terminals so as to be electrically connected to an external circuit board (not shown) such as a read/write board.

The element-side terminal 22 and the plurality of head-side terminals 25 are, in the central portion of the gimbal portion 10, disposed at spaced intervals to each other in the right-left direction. As shown in FIG. 2, each of the element-side terminal 22 and the plurality of head-side terminals 25 is formed into a generally rectangular square land shape in plane view extending from the front end portion of the tongue portion 14 rearwardly, to be more specific, is formed into a square land shape that is long in the front-rear direction. The element-side terminal 22 is disposed between a first head-side terminal 25a that is disposed at the right-most side and a second head-side terminal 25b that is disposed in adjacent to the left side of the first head-side terminal 25a. As referred to dashed lines in FIG. 1, the element-side terminal 22 is a terminal so as to be electrically connected to a connecting terminal 92 of a light emitting element 3 as one example of an electronic component. The head-side terminal 25 is a terminal so as to be electrically connected to a connecting terminal 91 of a magnetic head 90 that is mounted in a slider 2 as one example of an electronic component.

The element-side terminal 22 and the plurality of head-side terminals 25 are, when projected in the thickness direction, housed in the opening portion 16 in the metal supporting board 4. In other words, as shown in FIGS. 3X and 3Y, the metal supporting board 4 is not formed at the lower side of the element-side terminal 22 and the plurality of head-side terminals 25. The terminal extended portion 29 is integrally provided in the element-side terminal 22.

The terminal extended portion 29 is formed into a generally rectangular shape in plane view that is long in the front-rear direction and having the same width as that of the element-side terminal 22. The terminal extended portion 29 extends continuously from the element-side terminal 22 forwardly.

As shown in FIG. 1, the power source wire 23 and the plurality of signal wires 26 extend along the front-rear direction over the main body portion 9 and the gimbal portion 10 at spaced intervals to each other. To be more specific, the power source wire 23 and the plurality of signal wires 26 are, in the main body portion 9, formed to extend from the front ends of the power source-side terminal 21 and the plurality of external terminals 24 forwardly and then bend outwardly in the right-left direction at the front end thereof to extend forwardly so as to pass the outrigger portions 12. Thereafter, the power source wire 23 and the plurality of signal wires 26 bend inwardly in the right-left direction at the front end portions of the outrigger portions 12. As shown in FIG. 2, the power source wire 23 and the plurality of signal wires 26 are formed so as to bend rearwardly in the central portion in the right-left direction of the folded-back portion 13 and to be connected to the front end portions of the element-side terminal 22 and the plurality of head-side terminals 25 in the front end portion of the tongue portion 14. The power source wire 23 is, in a crossing portion 27 in the folded-back portion 13, provided so as to cross a second signal wire 26b that is connected to the second head-side terminal 25b in plane view.

As shown in FIGS. 1 and 2, the power source wire 23 is electrically connected to the power source via the power source-side terminal 21 and is electrically connected to the light emitting element 3 via the element-side terminal 22. The power source wire 23 is a power wire that conducts an electric current supplied from the power source (not shown) to the light emitting element 3. The plurality of signal wires 26 are electrically connected to the external circuit board via the plurality of external terminals 24 and are electrically connected to the magnetic head 90 in the slider 2 via the plurality of head-side terminals 25. The plurality of signal wires 26 are differential wires that transmit a differential signal (read signal and/or write signal).

As shown in FIG. 2, the power source wire 23 that is provided in the gimbal portion 10 includes a first extended portion 44 and a connecting end portion 28.

The first extended portion 44 is a portion of the power source wire 23 extending in the front-rear direction at the upper side of the tongue portion 14.

The connecting end portion 28 is provided in the rear end portion of the first extended portion 44. The connecting end portion 28 is formed into a generally rectangular shape (square land shape) in plane view that is wider than the first extended portion 44 and is narrower than the terminal extended portion 29. The front end portion of the terminal extended portion 29 is overlapped with the rear end portion of the connecting end portion 28 and is in contact therewith.

The signal wires 26 include second extended portions 55.

The second extended portions 55 are portions of the signal wires 26 extending in the front-rear direction at the upper side of the tongue portion 14. The second extended portions 55 and the above-described first extended portion 44 constitute one example of an extended portion. The head-side terminals 25 are connected to the rear ends of the second extended portions 55.

2. Layer Structure of Suspension Board with Circuit

As shown in FIGS. 3X and 4A, the suspension board with circuit 1 includes the metal supporting board 4, the base insulating layer 5 as one example of a first insulating layer, a first conductive layer 31, the intermediate insulating layer 6 as one example of a second insulating layer, a second conductive layer 32, the cover insulating layer 7, and the electrolytic plating layer 35.

The metal supporting board 4 forms an outer shape of the suspension board with circuit 1 and is formed of a metal foil or a metal thin plate in a flat plate shape.

As shown in FIGS. 3X and 4A, the base insulating layer 5 is provided on the metal supporting board 4. To be more specific, the base insulating layer 5 other than an exposed portion 42 to be described next is disposed on the upper surface of the metal supporting board 4 so that the outer shape thereof forms the generally same outer shape as that of the metal supporting board 4 in plane view.

That is, as shown in FIGS. 1 and 3X, the base insulating layer 5 has a base opening 60. The base opening 60 is formed into a generally rectangular shape in plane view. The base opening 60 is, when projected in the thickness direction, overlapped with the rear-side half portion of the opening portion 16 in the metal supporting board 4. In the front-rear direction, the rear end thereof is disposed at the rear side at spaced intervals to the rear end of the opening portion 16. In other words, the rear-side portion of the base opening 60 is, in plane view, overlapped with the metal supporting board 4.

A portion that is, when projected in the thickness direction, overlapped with the front-side half portion of the opening portion 16 in the base insulating layer 5 is the exposed portion 42. The lower surface of the exposed portion 42 is exposed from the opening portion 16. The rear end of the exposed portion 42 is, when projected in the thickness direction, disposed so as to be overlapped with the central portion in the front-rear direction of the opening portion 16 and is overlapped with the rear ends of the element-side terminal 22 and the head-side terminals 25. A portion excluding the exposed portion 42 in the base insulating layer 5 is a base disposing portion 41 as one example of a disposing portion. The base disposing portion 41 corresponds to the first conductive layer 31 and the second conductive layer 32 to be described later.

As shown in FIGS. 4A and 4C, the first conductive layer 31 is provided on the base insulating layer 5. As shown in FIGS. 1 and 4A, the first conductive layer 31 includes the above-described power source-side terminal 21 (ref: FIG. 1) and the power source wire 23.

As shown in FIGS. 3X and 4C, the intermediate insulating layer 6 is formed on the base insulating layer 5 so as to correspond to the signal wires 26, the external terminals 24 (ref: FIG. 1), and the head-side terminals 25.

As shown in FIGS. 3Y and 4A, the intermediate insulating layer 6 is provided so as to cover the power source wire 23. At the upper side of the gimbal portion 10, a portion of the intermediate insulating layer 6 that covers the first extended portion 44 of the power source wire 23 is an intermediate extended supporting portion 51. In the front-rear direction, the rear end of the intermediate extended supporting portion 51 is disposed at the front side at spaced intervals to the rear end of the first extended portion 44. To be specific, the intermediate extended supporting portion 51 covers the first extended portion 44 so as to expose the connecting end portion 28. The intermediate extended supporting portion 51 is one example of a covering portion.

The intermediate insulating layer 6 includes an intermediate supporting portion 52 at the upper side of the gimbal portion 10. The intermediate supporting portion 52 is provided on the upper surface of the base insulating layer 5, which is also a rear-side portion with respect to the rear end edge of the power source wire 23. The intermediate supporting portion 52 extends from the connecting end portion 28 of the power source wire 23 rearwardly so that the upper surface thereof is flush with the upper surface of the power source wire 23 (connecting end portion 28).

As shown in FIGS. 1 and 2, the second conductive layer 32 includes the external terminals 24, the signal wires 26, and the head-side terminals 25 in the above-described signal pattern 20 and the element-side terminal 22 and the terminal extended portion 29 in the above-described power source pattern 19.

That is, both of the head-side terminals 25 and the element-side terminal 22 are supported by the intermediate insulating layer 6 and are disposed on the same plane.

As shown in FIGS. 3Y and 4B, the terminal extended portion 29 is disposed in the rear side of the intermediate extended supporting portion 51 at the upper side of the gimbal portion 10 (tongue portion 14).

The element-side terminal 22 extends continuously from the terminal extended portion 29 rearwardly.

As shown in FIGS. 3X and 4A, the cover insulating layer 7 is provided on the base insulating layer 5 and the intermediate insulating layer 6 so as to expose each of the terminals. That is, as shown in FIGS. 3X and 3Y, at the upper side of the gimbal portion 10, the element-side terminal 22 and the head-side terminals 25 are not covered with the cover insulating layer 7 and the surfaces (the upper and side surfaces) thereof are exposed from the intermediate insulating layer 6 and the cover insulating layer 7. At the upper side of the main body portion 9, the power source-side terminal 21 and the external terminals 24 are not covered with the cover insulating layer 7 and the surfaces (the upper and side surfaces) thereof are exposed from the intermediate insulating layer 6 and the cover insulating layer 7.

The electrolytic plating layer 35 is provided so as to cover the surfaces (the upper and side surfaces) of the element-side terminal 22, the head-side terminals 25, the power source-side terminal 21 (ref: FIG. 1), and the external terminals 24 (ref: FIG. 1).

Of the above-described intermediate insulating layer 6, portions in the intermediate insulating layer 6 that are formed below the second extended portions 55 are intermediate extended supporting portions 45. Of the above-described intermediate insulating layer 6, portions in the intermediate insulating layer 6 that are formed below the head-side terminals 25 are intermediate head supporting portions 46. Of the above-described base insulating layer 5, portions in the base insulating layer 5 that are formed below the intermediate head supporting portions 46 are base head supporting portions 48 and portions in the base insulating layer 5 that are formed below the intermediate extended supporting portions 45 are base extended supporting portions 61. The base extended supporting portions 61 are a part of the exposed portion 42. As described above, below the base head supporting portions 48 and the base extended supporting portions 61, the opening portion 16 is formed in the metal supporting board 4 and the metal supporting board 4 is not formed. In the front-rear direction, the rear ends of the intermediate head supporting portions 46 and the rear ends of the base head supporting portions 48 are disposed at the same position as that of the rear ends (free end edges) of the head-side terminals 25.

Of the above-described intermediate supporting portion 52 (intermediate insulating layer 6), a portion in the intermediate supporting portion 52 (intermediate insulating layer 6) that is formed below the element-side terminal 22 is an intermediate element supporting portion 53. Of the above-described base insulating layer 5, a portion in the base insulating layer 5 that is formed below the intermediate element supporting portion 53 is a base element supporting portion 49 and a portion in the base insulating layer 5 that is formed below the first extended portion 44 is a base extended supporting portion 62. The base extended supporting portion 62 is a part of the exposed portion 42. As described above, below the base element supporting portion 49 and the base extended supporting portion 62, the opening portion 16 is formed in the metal supporting board 4 and the metal supporting board 4 is not formed. In the front-rear direction, the rear end of the intermediate element supporting portion 53 and the rear end of the base element supporting portion 49 are disposed at the same position as the rear end (free end edge) of the element-side terminal 22.

The intermediate element supporting portion 53 and the intermediate head supporting portions 46 constitute one example of a second terminal supporting portion. The base element supporting portion 49 and the base head supporting portions 48 constitute one example of a first terminal supporting portion. The intermediate extended supporting portions 45 and the intermediate extended supporting portion 51 constitute one example of a first extended supporting portion. The base extended supporting portions 61 and the base extended supporting portion 62 constitute one example of a second extended supporting portion.

3. Method for Producing Suspension Board with Circuit

Next, a method for producing the suspension board with circuit 1 is described with reference to FIGS. 5A to 5D, 6A to 6E, 7E to 7G, and 8F to 8H.

First, in this method, as shown in FIGS. 5A and 6A, the metal supporting board 4 is prepared. Examples of a metal material of the metal supporting board 4 include stainless steel and 42-alloy. Preferably, stainless steel or the like is used.

The metal supporting board 4 has a thickness of, for example, 5 µm or more, or preferably 10 µm or more, and, for example, 60 µm or less, or preferably 25 µm or less.

Next, in this method, as shown in FIGS. 5A and 6B, the base insulating layer 5 is provided on the metal supporting board 4 in the above-described pattern.

Examples of an insulating material of the base insulating layer 5 include synthetic resins such as polyimide, polyether nitrile, polyether sulfone, polyethylene terephthalate, polyethylene naphthalate, and polyvinyl chloride. Of these, preferably, a synthetic resin having photosensitivity is used, or more preferably, photosensitive polyimide is used.

To provide the base insulating layer 5 on the metal supporting board 4, for example, a solution (varnish) of a synthetic resin having photosensitivity is applied onto the upper surface of the metal supporting board 4 to be then dried. After drying, the applied surface is subjected to pattern exposure to light and is developed to be then, if necessary cured. The formation of the base insulating layer 5 is not limited to the above-described method. For example, the synthetic resin is formed into a film having the above-described pattern in advance and then, the film can be also attached to the upper surface of the metal supporting board 4 via a known adhesive layer.

The base insulating layer 5 has a thickness of, for example, 1 μm or more, or preferably 4 μm or more, and, for example, 30 μm or less, or preferably 10 μm or less.

Next, in this method, as shown in FIG. 6C, the first conductive layer 31 is provided on the base insulating layer 5 in the above-described pattern.

Examples of a conductive material of the first conductive layer 31 include copper, nickel, gold, and solder or an alloy thereof. Of these, preferably, copper is used.

To provide the first conductive layer 31, for example, known patterning methods such as an additive method and a subtractive method are used. Preferably, an additive method is used.

A size of the first conductive layer 31 is appropriately set. The power source-side terminal 21 has a width of, for example, 15 μm or more, or preferably 20 μm or more, and, for example, 1000 μm or less, or preferably 800 μm or less. The power source wire 23 has a width of, for example, 1 μm or more, or preferably 4 μm or more, and, for example, 500 μm or less, or preferably 100 μm or less. The connecting end portion 28 has a length in the front-rear direction and a length in the right-left direction of, for example, 5 μm or more, or preferably 10 μm or more, and, for example, 500 μm or less, or preferably 200 μm or less, The first conductive layer 31 has a thickness of, for example, 1 μm or more, or preferably 4 μm or more, and, for example, 30 μm or less, or preferably 20 μm or less.

Next, in this method, as shown in FIGS. 5C and 6D, the intermediate insulating layer 6 is provided on the base insulating layer 5 in the above-described pattern.

An example of the insulating material of the intermediate insulating layer 6 includes the same insulating material as that of the base insulating layer 5.

To provide the intermediate insulating layer 6, for example, a solution (varnish) of a synthetic resin having photosensitivity is applied onto the base insulating layer 5 to be then dried. After drying, the applied surface is subjected to pattern exposure to light and is developed to be then, if necessary, cured. The formation of the intermediate insulating layer 6 is not limited to the above-described method. For example, the synthetic resin is formed into a film having the above-described pattern in advance and then, the film can be also attached to the upper surface of the base insulating layer 5 via a known adhesive layer.

The intermediate insulating layer 6 has a thickness of, for example, 1 μm or more, or preferably 2 μm or more, and, for example, 30 μm or less, or preferably 10 μm or less.

Next, in this method, as shown in FIGS. 5D and 6E, the second conductive layer 32 is provided in the above-described pattern.

An example of the conductive material of the second conductive layer 32 includes the same metal material as that of the first conductive layer 31.

To provide the second conductive layer 32, the same patterning method as that described above is used. Preferably, an additive method is used.

A size of the second conductive layer 32 is appropriately set. Each of the plurality of external terminals 24, each of the plurality of head-side terminals 25, and the element-side terminal 22 have a width of, for example, 15 μm or more, or preferably 20 μm or more, and, for example, 1000 μm or less, or preferably 800 μm or less. An interval between the plurality of external terminals 24, an interval between the plurality of head-side terminals 25, and an interval between the element-side terminal 22 and the first head-side terminal 25a (and the second head-side terminal 25b) are, for example, 15 μm or more, or preferably 20 μm or more, and, for example, 1000 μm or less, or preferably 800 μm or less. The signal wire 26 has a width of, for example, 1 μm or more, or preferably 4 μm or more, and, for example, 1000 μm or less, or preferably 800 μm or less. The second conductive layer 32 has a thickness of, for example, 1 μm or more, or preferably 4 μm or more, and, for example, 30 μm or less, or preferably 20 μm or less.

Figure 7E:
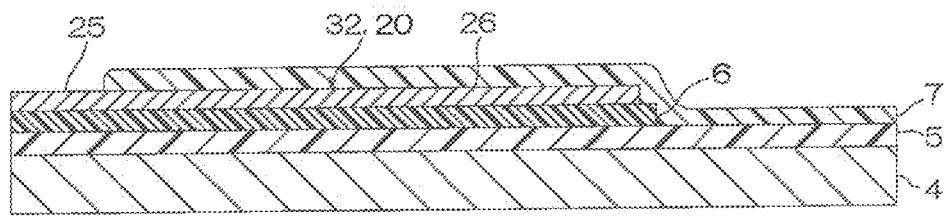
FIGS. 7E to 7G, subsequent to FIG. 5D, show process drawings for illustrating a method for producing a suspension board with circuit and show sectional views corresponding to FIG. 3X.
Figure 8F:
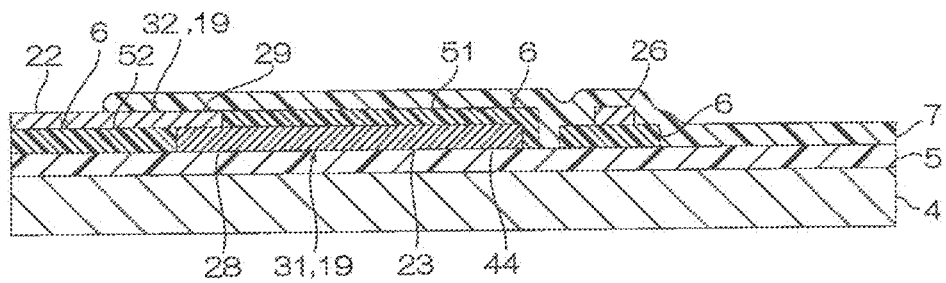
FIGS. 8F to 8H, subsequent to FIG. 6E, show process drawings for illustrating a method for producing a suspension board with circuit and show sectional views corresponding to FIG. 3Y.

Next, in this method, as shown in FIGS. 7E and 8F, the cover insulating layer 7 is provided on the intermediate insulating layer 6 and the base insulating layer 5 in the above-described pattern.

Then, the cover insulating layer 7 exposes the surfaces of the element-side terminal 22, the head-side terminals 25, the power source-side terminal 21 (ref: FIG. 1), and the external terminals 24 (ref: FIG. 1) and covers the signal wires 26.

An example of the insulating material of the cover insulating layer 7 includes the same insulating material as that of the base insulating layer 5.

To provide the cover insulating layer 7, for example, a solution (varnish) of a synthetic resin having photosensitivity is applied onto the upper surfaces of the base insulating layer 5 and the intermediate insulating layer 6 to be then dried. After drying, the applied surfaces are subjected to pattern exposure to light and are developed to be then, if necessary, cured. The formation of the cover insulating layer 7 is not limited to the above-described method. For example, the synthetic resin is formed into a film having the above-described pattern in advance and then, the film can be also attached to the upper surfaces of the base insulating layer 5 and the intermediate insulating layer 6 via a known adhesive layer.

The cover insulating layer 7 has a thickness of, for example, 1 μm or more, or preferably 2 μm or more, and, for example, 30 μm or less, or preferably 10 μm or less.

Figure 7F:
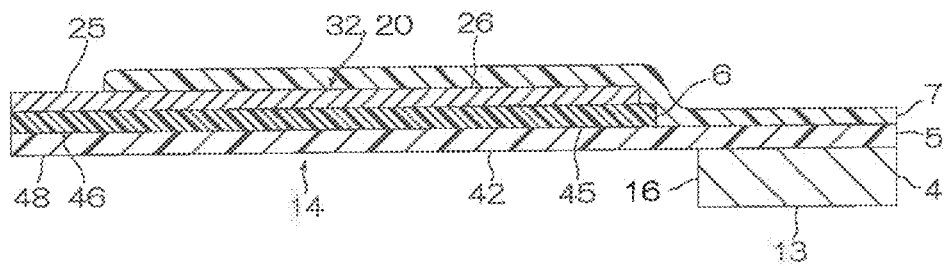
Figure 8G:
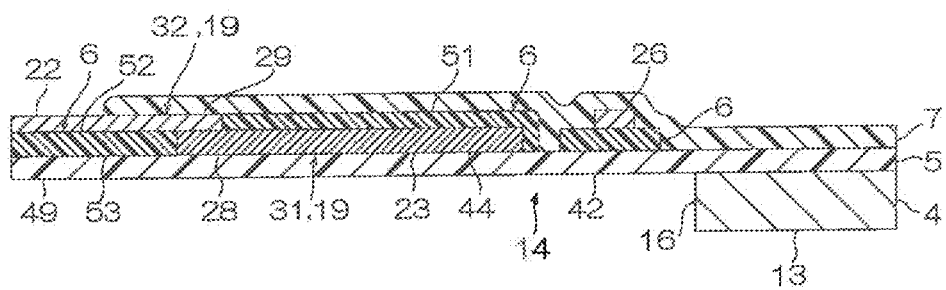

Next, in this method, as shown in FIGS. 7F and 8G the opening portion 16 and the slit 11 (ref: FIG. 1) are formed. To be more specific, the metal supporting board 4 corresponding to the opening portion 16 and the slit 11 is removed. In this manner, the lower surface of the exposed portion 42 in the base insulating layer 5 is exposed.

To provide the opening portion 16 and the slit 11, for example, methods such as etching methods including dry etching (e.g., plasma etching) or wet etching (e.g., chemical etching); drilling; and laser processing are used. Preferably, the opening portion 16 and the slit 11 are formed by wet etching.

Figure 7G:
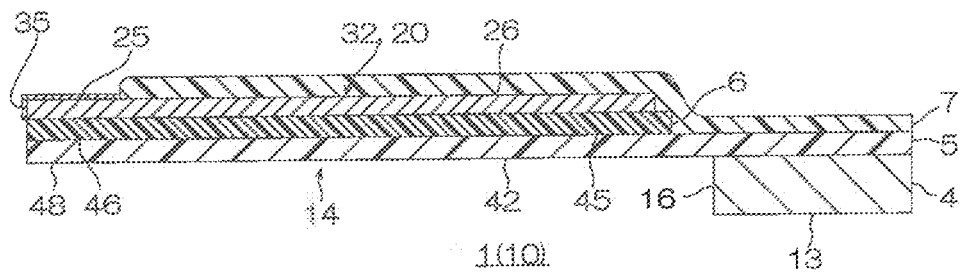
Figure 8H:
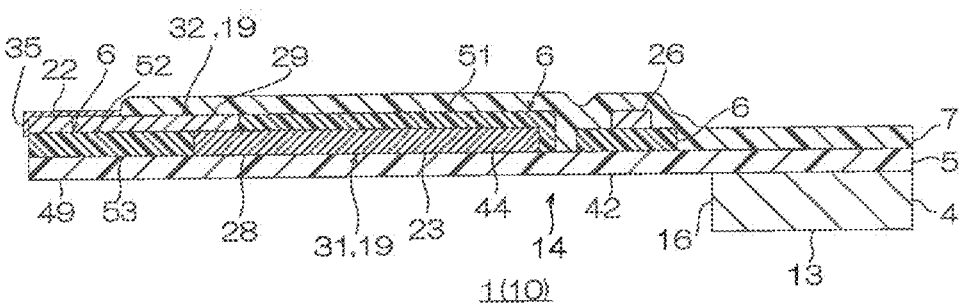

Next, in this method, as shown in FIGS. 7G and 8H, the electrolytic plating layer 35 is provided so as to cover the surfaces (the upper and side surfaces) of the element-side terminal 22 and the head-side terminals 25 and the surfaces (the upper and side surfaces) of the power source-side terminal 21 and the external terminals 24 (ref: FIG. 1).

The electrolytic plating layer 35 is provided by, for example, a known method of being electrically conducted to the second conductive layer 32, while being immersed in an electrolytic plating solution.

Examples of a plating material of the electrolytic plating layer 35 include conductor protecting materials such as gold, chromium, nickel, or an alloy thereof.

Next, though not shown, the metal supporting board 4 is trimmed as needed.

In this manner, the suspension board with circuit 1 is obtained.

Thereafter, as shown by the dashed lines in FIG. 1, in the tongue portion 14, the slider 2 and the light emitting element 3 are mounted on a part of the metal supporting board 4 that is exposed from the base opening 60. The slider 2 and the light emitting element 3 are integrally formed.

As shown in FIGS. 3X and 3Y, the connecting terminals 91 of the magnetic head 90 in the slider 2 are connected to the plurality of head-side terminals 25 and the connecting terminal 92 of the light emitting element 3 is connected to the element-side terminal 22. Thereafter, the suspension board with circuit 1 is mounted on a hard disk drive.

Then, a terminal of a power source is electrically connected to the power source-side terminal 21 and terminals of an external circuit board (not shown) are electrically connected to the external terminals 24.

4. Function and Effect

According to the suspension board with circuit 1, as shown in FIG. 3X, the opening portion 16 is formed in the metal supporting board 4 at the lower side of the head-side terminals 25. As shown in FIG. 3Y, the opening portion 16 is formed in the metal supporting board 4 at the lower side of the element-side terminal 22.

Thus, when the metal supporting board 4 and the magnetic head 90 expand at different proportions and stress is applied to connecting portions between the connecting terminals 91 of the magnetic head 90 and the head-side terminals 25 in a state where the head-side terminals 25 are connected to the connecting terminals 91 of the magnetic head 90, the stress can be relaxed. Also, when the metal supporting board 4 and the light emitting element 3 expand at different proportions and stress is applied to a connecting portion between the connecting terminal 92 of the light emitting element 3 and the element-side terminal 22 in a state where the element-side terminal 22 is connected to the connecting terminal 92 of the light emitting element 3, the stress can be relaxed.

The intermediate head supporting portions 46 are formed below the head-side terminals 25 and the base head supporting portions 48 are formed below the intermediate head supporting portions 46. As shown in FIG. 3Y, the intermediate element supporting portion 53 is formed below the element-side terminal 22 and the base element supporting portion 49 is formed below the intermediate element supporting portion 53.

Thus, the head-side terminals 25 can be reinforced by the intermediate head supporting portions 46 and the base head supporting portions 48. The element-side terminal 22 can be reinforced by the intermediate element supporting portion 53 and the base element supporting portion 49.

According to the suspension board with circuit 1, as shown in FIG. 3X, the rear ends of the intermediate head supporting portions 46 and the rear ends of the base head supporting portions 48 are, in the front-rear direction, disposed at the same position as those (free end edges) of the head-side terminals 25. As shown in FIG. 3Y, the rear end of the intermediate element supporting portion 53 and the rear end of the base element supporting portion 49 are, in the front-rear direction, disposed at the same position as that (free end edge) of the element-side terminal 22.

Thus, the head-side terminals 25 can be supported by the entire intermediate head supporting portions 46 and the base head supporting portions 48. In the same manner, the element-side terminal 22 can be supported by the entire intermediate element supporting portion 53 and the base element supporting portion 49.

According to the suspension board with circuit 1, as shown in FIG. 3X, the intermediate extended supporting portions 45 and the base extended supporting portions 61 are, when projected in the thickness direction, housed in the opening portion 16 in the metal supporting board 4. As shown in FIG. 3Y, the intermediate extended supporting portion 51 and the base extended supporting portion 62 are, when projected in the thickness direction, housed in the opening portion 16 in the metal supporting board 4.

Thus, the stress applied to the periphery of the second extended portions 55 can be relaxed. Also, the stress applied to the periphery of the first extended portion 44 can be relaxed.

As a result, the stress applied to the connecting portions between the connecting terminals 91 of the magnetic head 90 and the head-side terminals 25 can be further relaxed. Also, the stress applied to the connecting portion between the connecting terminal 92 of the light emitting element 3 and the element-side terminal 22 can be further relaxed.

As shown in FIG. 3X, the intermediate extended supporting portions 45 and the base extended supporting portions 61 are, when projected in the thickness direction, overlapped with the second extended portions 55. Also, as shown in FIG. 3Y, the intermediate extended supporting portion 51 and the base extended supporting portion 62 are, when projected in the thickness direction, overlapped with the first extended portion 44.

Thus, the second extended portions 55 can be reinforced by the intermediate extended supporting portions 45 and the base extended supporting portions 61. Also, the first extended portion 44 can be reinforced by the intermediate extended supporting portion 51 and the base extended supporting portion 62.

5. Modified Examples

Each of the modified examples of the suspension board with circuit is described with reference to FIGS. 9A to 12C. In each of the modified examples, the same reference numerals are provided for members corresponding to each of those in the above-described embodiment, and their detailed description is omitted.

(1) Second Embodiment

In the above-described first embodiment, as shown in FIG. 4C, the power source pattern 19 and the signal pattern 20 are provided in the suspension board with circuit 1.

On the contrary, in the second embodiment, the signal pattern 20 only, as a conductive pattern, is provided in the suspension board with circuit 1.

To be more specific, as shown in FIG. 9A, the signal pattern 20 in the suspension board with circuit 1 includes a first write wire 71, a second write wire 72, a first read wire 73, and a second read wire 74. The first write wire 71 and the second write wire 72 constitute a differential wire and the first read wire 73 and the second read wire 74 constitute a differential wire.

The first write wire 71 is formed of the first conductive layer 31 and is provided on the base insulating layer 5. The first write wire 71 is covered with the intermediate insulating layer 6. The second write wire 72 is provided on the intermediate insulating layer 6 that covers the first write wire 71.

The second write wire 72 is formed of the second conductive layer 32 and is covered with the cover insulating layer 7. The first write wire 71 and the second write wire 72 are a wire for transmitting a write signal and are connected to the head-side terminals 25 (ref: FIG. 1).

The first read wire 73 is formed of the first conductive layer 31 and is provided on the base insulating layer 5. The first read wire 73 is disposed at spaced intervals to the first write wire 71 in the right-left direction. The first read wire 73 is covered with the intermediate insulating layer 6. The second read wire 74 is provided on the intermediate insulating layer 6 that covers the first read wire 73.

The second read wire 74 is formed of the second conductive layer 32 and is covered with the cover insulating layer 7. The first read wire 73 and the second read wire 74 are a wire for transmitting a read signal and are connected to the head-side terminals 25 (ref: FIG. 1).

Though not shown, at the upper side of the tongue portion 14, the head-side terminal 25 that is connected to the first write wire 71 and the head-side terminal 25 that is connected to the first read wire 73 are continuous to the terminal extended portion 29 that is connected to the upper surface of the rear end portion (connecting end portion 28) of the first extended portion 44 extending from the first write wire 71 and the first read wire 73 in the same manner as the element-side terminal 22 in FIG. 3Y. The intermediate element supporting portion 53 of the intermediate insulating layer 6 is provided below the head-side terminal 25 that is connected to the first write wire 71 and the head-side terminal 25 that is connected to the first read wire 73; the base element supporting portion 49 of the base insulating layer 5 is provided below the intermediate element supporting portion 53 of the intermediate insulating layer 6; and an opening is formed in the metal supporting board 4 below the base element supporting portion 49 of the base insulating layer 5. In the same manner, at the upper side of the tongue portion 14, the intermediate head supporting portion 46 of the intermediate insulating layer 6 is provided below the head-side terminal 25 that is connected to the second write wire 72 and the head-side terminal 25 that is connected to the second read wire 74 in the same manner as the head-side terminal 25 in FIG. 3X; the base head supporting portion 48 of the base insulating layer 5 is provided below the intermediate head supporting portion 46 of the intermediate insulating layer 6; and an opening is formed in the metal supporting board 4 below the base head supporting portion 48 of the base insulating layer 5.

According to the second embodiment of the suspension board with circuit 1, the same effect as that of the above-described first embodiment is achieved.

The signal pattern 20 in the suspension board with circuit 1 includes the first write wire 71, the second write wire 72, the first read wire 73, and the second read wire 74. The first write wire 71 and the second write wire 72 are laminated, and the first read wire 73 and the second read wire 74 are laminated in the up-down direction.

Thus, high density of the wire can be accomplished.

(2) Third Embodiment

In the above-described first embodiment, as shown in FIG. 4C, the power source pattern 19 and the signal pattern 20 are provided in the suspension board with circuit 1.

On the contrary, in the third embodiment, as a conductive pattern, the signal pattern 20 and a ground pattern 81 are provided in the suspension board with circuit 1.

To be more specific, as shown in FIG. 9B, the ground pattern 81 in the suspension board with circuit 1 is formed of the first conductive layer 31 and includes a ground wire 82 and a ground terminal 83.

The ground wire 82 is provided on the base insulating layer 5. The ground wire 82 is connected to the ground terminal 83 and a piezoelectric-side terminal that is not shown. The ground terminal 83 is connected to the metal supporting board 4. The piezoelectric-side terminal is continuous to the terminal extended portion 29 that is connected to the upper surface of the rear end portion (connecting end portion 28) of the first extended portion 44 that extends from the ground wire 82 in the same manner as the element-side terminal 22 in FIG. 3Y. The intermediate element supporting portion 53 of the intermediate insulating layer 6 is provided below the piezoelectric-side terminal that is connected to the ground wire 82; the base element supporting portion 49 of the base insulating layer 5 is provided below the intermediate element supporting portion 53 of the intermediate insulating layer 6; and an opening is formed in the metal supporting board 4 below the base element supporting portion 49 of the base insulating layer 5. The ground wire 82 is covered with the intermediate insulating layer 6. The signal wire 84 that is the signal pattern 20 is provided on the intermediate insulating layer 6 that covers the ground wire 82. The signal pattern 20 is formed of the second conductive layer 32. The signal wire 84 is connected to the head-side terminals 25 (ref: FIG. 1).

Although not shown, at the upper side of the tongue portion 14, the intermediate head supporting portion 46 of the intermediate insulating layer 6 is provided below the head-side terminal 25 that is connected to the signal wire 84 in the same manner as the head-side terminal 25 in FIG. 3X; the base head supporting portion 48 of the base insulating layer 5 is provided below the intermediate head supporting portion 46 of the intermediate insulating layer 6; and an opening is formed in the metal supporting board 4 below the base head supporting portion 48 of the base insulating layer 5.

According to the third embodiment of the suspension board with circuit 1, the same effect as that of the above-described first embodiment is achieved.

The ground wire 82 and the signal wire 84 are laminated in the up-down direction.

Thus, high density of the wire is accomplished and the wire can be ground connected.

(3) Fourth Embodiment

In the above-described first embodiment, as shown in FIGS. 1 and 2, the first conductive layer 31 includes the power source-side terminal 21 and the power source wire 23 in the suspension board with circuit 1.

On the contrary, in the fourth embodiment, the first conductive layer 31 includes a reinforcing portion for reinforcing the suspension board with circuit 1 in addition to the power source-side terminal 21 and the power source wire 23.

Figure 10:
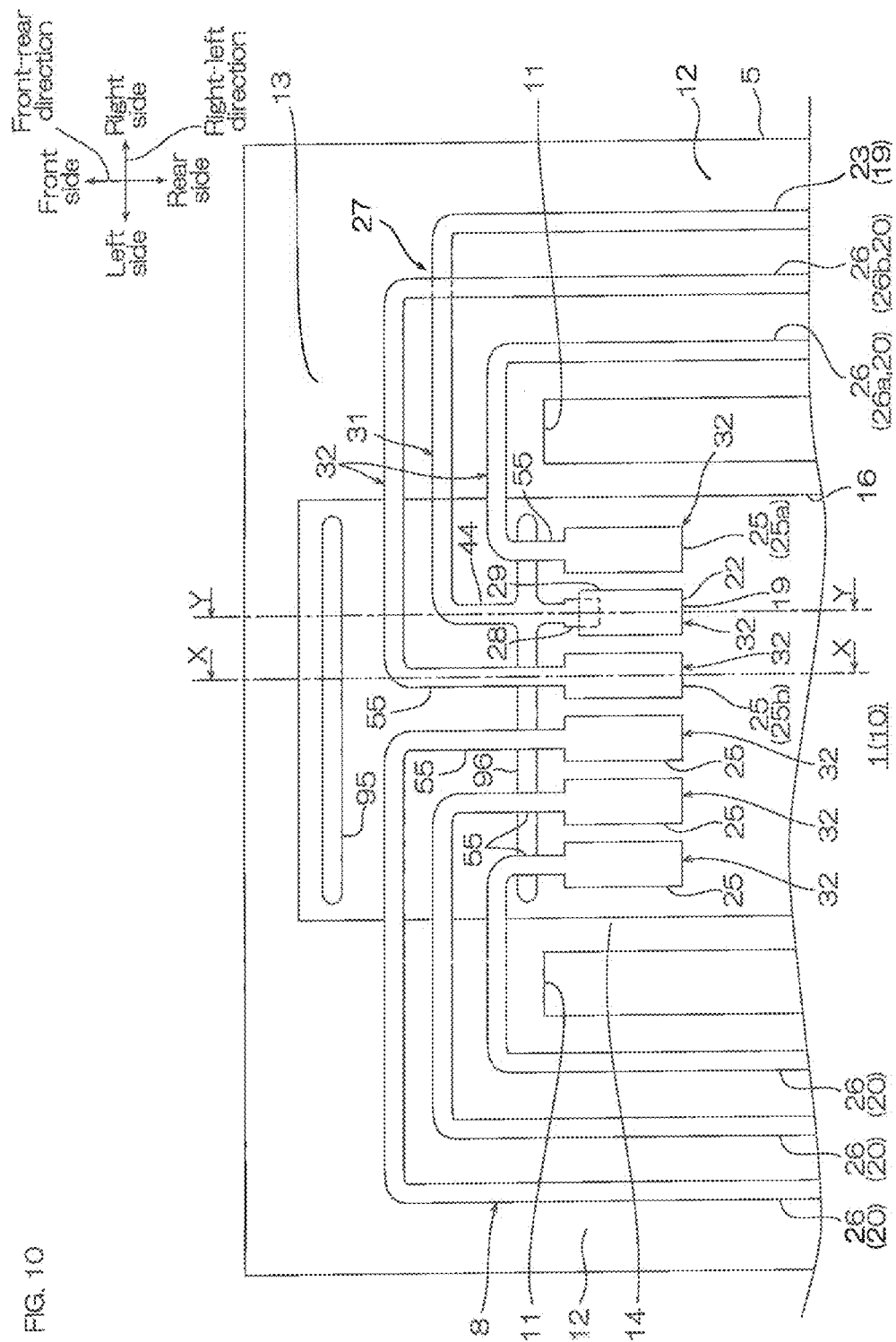
FIG. 10 shows an enlarged plan view of a folded-back portion and a tongue portion of a fourth embodiment of a suspension board with circuit of the present invention.

To be more specific, as shown in FIG. 10, the first conductive layer 31 includes an outer-side conductive reinforcing portion 95 and an inner-side conductive reinforcing portion 96. The outer-side conductive reinforcing portion 95 and the inner-side conductive reinforcing portion 96 constitute one example of a conductive reinforcing portion.

The outer-side conductive reinforcing portion 95 is provided in the gimbal portion 10 and extends in the right-left direction. To be specific, the outer-side conductive reinforcing portion 95 is positioned at the front side with respect to the power source wire 23 and the signal wire 26 that are folded back in the folded-back portion 13 in the gimbal portion 10 and is, in plane view, overlapped with the front-side portion of the opening portion 16. That is, the outer-side conductive reinforcing portion 95 is, in plane view, disposed at the outer side of a region in which the power source wire 23 and the signal wire 26 are disposed.

As shown in FIGS. 11X and 11Y, the outer-side conductive reinforcing portion 95 is, in the gimbal portion 10, formed on the base insulating layer 5. The outer-side conductive reinforcing portion 95 is covered with the intermediate insulating layer 6.

As shown in FIG. 10, the inner-side conductive reinforcing portion 96 is provided in the gimbal portion 10 and extends in the right-left direction. To be specific, the inner-side conductive reinforcing portion 96 is, in plane view, overlapped with the central portion of the opening portion 16. That is, the inner-side conductive reinforcing portion 96 is, in plane view, disposed in a region in which the power source wire 23 and the signal wire 26 are disposed.

The inner-side conductive reinforcing portion 96 is continuous to the first extended portion 44. To be more specific, the inner-side conductive reinforcing portion 96 extends continuously from the rear-side portion of the first extended portion 44 in the right-left direction. The inner-side conductive reinforcing portion 96 is orthogonal to (crosses) the plurality (five pieces) of second extended portions 55.

As shown in FIGS. 11X and 11Y, the inner-side conductive reinforcing portion 96 is, in the gimbal portion 10, formed on the base insulating layer 5. The inner-side conductive reinforcing portion 96 is covered with the intermediate insulating layer 6.

The outer-side conductive reinforcing portion 95 and the inner-side conductive reinforcing portion 96 are formed as a layer of the first conductive layer 31 in a layer structure. That is, the outer-side conductive reinforcing portion 95 and the inner-side conductive reinforcing portion 96 are simultaneously formed at the time of forming the power source-side terminal 21 and the power source wire 23 in the first conductive layer 31.

According to the fourth embodiment of the suspension board with circuit 1, the same effect as that of the above-described first embodiment is achieved.

The outer-side conductive reinforcing portion 95 and the inner-side conductive reinforcing portion 96 extend in the right-left direction.

Thus, when force is applied in a direction orthogonal to the front-rear direction with respect to the suspension board with circuit 1, the suspension board with circuit 1 is reinforced by the outer-side conductive reinforcing portion 95 and the inner-side conductive reinforcing portion 96 and a warp of the suspension board with circuit 1 can be suppressed.

The inner-side conductive reinforcing portion 96, when projected in the thickness direction, crosses the second extended portion 55 of the signal wire 26.

Thus, the region in which the second extended portion 55 is disposed in the suspension board with circuit 1 can be reinforced by the inner-side conductive reinforcing portion 96.

Thus, a warp of the region in which the second extended portion 55 is disposed in the suspension board with circuit 1 can be suppressed.

(4) Fifth Embodiment

In the above-described first embodiment, as shown in FIG. 4A, the intermediate insulating layer 6 is formed on the base insulating layer 5 so as to cover the first conductive layer 31 or to correspond to the second conductive layer 32 in the suspension board with circuit 1.

On the contrary, in the fifth embodiment, the intermediate insulating layer 6 is provided on the base insulating layer 5 so that the shape thereof in plane view is generally the same as that of the base insulating layer 5 in the suspension board with circuit 1.

To be more specific, as shown in FIGS. 12A and 12C, the intermediate insulating layer 6 is, in the base insulating layer 5, provided so as to cover the power source wire 23 in a portion in which the power source wire 23 in the first conductive layer 31 is disposed and is provided on the upper surface of the base insulating layer 5 in a portion in which the power source wire 23 is not disposed.

As shown in FIG. 12B, the upper surface of the connecting end portion 28 is not covered with the intermediate insulating layer 6 so as to ensure a connecting region between the connecting end portion 28 and the terminal extended portion 29.

According to the fifth embodiment of the suspension board with circuit 1, the same effect as that of the above-described first embodiment is achieved.

The intermediate insulating layer 6 is provided on the base insulating layer 5 so that the shape thereof in plane view is generally the same as that of the base insulating layer 5.

Thus, when external force is applied with respect to the suspension board with circuit 1, the suspension board with circuit 1 is reinforced by the intermediate insulating layer 6 and a warp of the suspension board with circuit 1 can be suppressed.

(5) Another Modified Example

In the description of the above-described embodiment, the power source-side terminal 21 is composed of the first conductive layer 31 and the external terminals 24 are composed of the second conductive layer 32. Alternatively, all of the power source-side terminal 21 and external terminals 24 may be also composed of the first conductive layer 31 or the second conductive layer 32.

In this manner, all of the power source-side terminal 21 and external terminals 24 can be disposed on the same plane.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
   a metal supporting board,
   a first insulating layer including a disposing portion formed at one side in a thickness direction of the metal supporting board with respect to the metal supporting board,
   a first conductive layer including a first wire portion formed at the one side with respect to the first insulating layer,
   a second insulating layer including a covering portion covering the first wire portion, and a second conductive layer including a second wire portion formed at the one side with respect to the second insulating layer and a terminal portion connected to the first wire portion or the second wire portion, wherein the second insulating layer includes a second terminal supporting portion formed at the other side in the thickness direction with respect to the terminal portion;

the first insulating layer includes a first terminal supporting portion formed at the other side with respect to the second terminal supporting portion; and the metal supporting board is not formed at the other side with respect to the first terminal supporting portion.

2. The suspension board with circuit according to claim 1, wherein the terminal portion has a free end edge and the first terminal supporting portion and the second terminal supporting portion extend to the free end edge.

3. The suspension board with circuit according to claim 1, wherein the first wire portion or the second wire portion includes an extended portion extending from a connecting portion with the terminal portion along a longitudinal direction of the terminal portion;

the second insulating layer further includes a second extended supporting portion that is, when projected in the thickness direction, overlapped with the extended portion;

the first insulating layer further includes a first extended supporting portion that is, when projected in the thickness direction, overlapped with the extended portion; and the metal supporting board is, when projected in the thickness direction, not overlapped with the extended portion.

4. The suspension board with circuit according to claim 1, wherein the first conductive layer includes a conductive reinforcing portion extending in a direction crossing the longitudinal direction of the terminal portion and the metal supporting board is, when projected in the thickness direction, not overlapped with the conductive reinforcing portion.

5. The suspension board with circuit according to claim 4, wherein the conductive reinforcing portion, when projected in the thickness direction, crosses the second wire portion.

* * * * *